United States Patent
Na et al.

(10) Patent No.: US 10,845,424 B2
(45) Date of Patent: Nov. 24, 2020

(54) APPARATUS AND METHOD FOR DIAGNOSING FAILURE OF ELECTROMAGNETIC-INDUCTIVE POWER SUPPLY APPARATUS

(71) Applicant: AMOSENSE CO., LTD, Cheonan-si (KR)

(72) Inventors: Won-San Na, Seoul (KR); Jin-Pyo Park, Seoul (KR); Jung-Hyun Choi, Gwangju-si (KR)

(73) Assignee: AMOSENSE CO., LTD, Cheonan-si (KR)

( * ) Notice: Subject to any disclaimer, the term of this patent is extended or adjusted under 35 U.S.C. 154(b) by 61 days.

(21) Appl. No.: 16/340,317

(22) PCT Filed: Oct. 11, 2017

(86) PCT No.: PCT/KR2017/011192
§ 371 (c)(1),
(2) Date: Apr. 8, 2019

(87) PCT Pub. No.: WO2018/070777
PCT Pub. Date: Apr. 19, 2018

(65) Prior Publication Data
US 2019/0257893 A1 Aug. 22, 2019

(30) Foreign Application Priority Data
Oct. 11, 2016 (KR) .......................... 10-2016-0131430

(51) Int. Cl.
*G01R 31/40* (2020.01)
*G01R 15/18* (2006.01)
(Continued)

(52) U.S. Cl.
CPC ............. *G01R 31/40* (2013.01); *G01R 15/18* (2013.01); *G01R 19/165* (2013.01); *H02J 50/10* (2016.02)

(58) Field of Classification Search
CPC .... G01R 15/18; G01R 15/183; G01R 15/185; G01R 15/186; G01R 15/205; G01R 19/20;
(Continued)

(56) References Cited

U.S. PATENT DOCUMENTS 9,188,610 B1 * 11/2015 Edel ..................... G01R 15/183
2010/0153036 A1 6/2010 Elwarry et al.
(Continued)

FOREIGN PATENT DOCUMENTS

KR 2010-0067701 A 6/2010
KR 10-1317220 B1 10/2013
(Continued)

*Primary Examiner* — Minh N Tang
(74) *Attorney, Agent, or Firm* — CL Intellectual LLC (57) ABSTRACT

Disclosed are an apparatus and a method for diagnosing a failure of an electromagnetic-inductive power supply apparatus, which diagnoses whether a power-generation CT has failed by comparing the values detected in a sensor CT and the power-generation CT, thereby preventing the generating efficiency from being reduced. The disclosed apparatus for diagnosing the failure of the electromagnetic-inductive power supply apparatus detects detection values of a power-generation CT and a sensor CT, converts detection values into converted value by scaling detection values, and diagnoses whether the current transformer has failed and whether the power-outage has occurred based on converted values.

18 Claims, 5 Drawing Sheets

(51) Int. Cl.
*H02J 50/10* (2016.01)
*G01R 19/165* (2006.01)

(58) Field of Classification Search
CPC .... G01R 19/165; G01R 31/027; G01R 31/40;
H02J 50/10; H02M 7/06; H02M 7/12;
H01F 27/02; H01F 27/28; H01F 27/30;
H01F 27/402; H01F 27/427; H01F 38/14;
H01F 38/16; H01F 38/20; H01F 38/30;
H01F 38/32
See application file for complete search history.

(56) References Cited

U.S. PATENT DOCUMENTS

| | | | |
|---|---|---|---|
| 2012/0038446 A1 | 2/2012 | McBee et al. | |
| 2014/0015328 A1 | 1/2014 | Beaver et al. | |
| 2016/0005534 A1* | 1/2016 | Koo | G01R 15/186 |
| | | | 455/41.1 |

FOREIGN PATENT DOCUMENTS

| | | |
|---|---|---|
| KR | 2015-0101298 A | 9/2015 |
| KR | 10-1568942 B1 | 11/2015 |

\* cited by examiner

APPARATUS AND METHOD FOR DIAGNOSING FAILURE OF ELECTROMAGNETIC-INDUCTIVE POWER SUPPLY APPARATUS

CROSS-REFERENCE TO RELATED APPLICATIONS

This application is a National Stage of International patent application PCT/KR2017/011192, filed on Oct. 11, 2017, which claims priority to foreign Korean patent application No. KR 10-2016-0131430, filed on Oct. 11, 2016, the disclosures of which are incorporated by reference in their entirety.

FIELD OF THE INVENTION

The present disclosure relates to an apparatus and a method for diagnosing a failure of an electromagnetic-inductive power supply apparatus, and more particularly, to an apparatus and a method for diagnosing a failure of an electromagnetic-inductive power supply apparatus, which diagnoses whether a current transformer (i.e., a power-generation current transformer or a sensor current transformer) of an electromagnetic-inductive power supply apparatus has failed and whether the power outage has occurred.

BACKGROUND

Recently, various types of electromagnetic-inductive power supply apparatuses have been developed as the interest in a power supply method using the electromagnetic-inductive phenomenon is increasing.

The electromagnetic-inductive type power supply apparatus includes a current transformer installed at a power line in which a large-capacity current flows, such as a transmission line or a distribution line. The electromagnetic-inductive type power supply apparatus converts the power acquired by the electromagnetic-inductive phenomenon in the current transformer into DC to supply it to a load.

The electromagnetic-inductive type power supply apparatus is configured to include a sensor current transformer for detecting a current (or a voltage) flowing in the power line and a power-generation current transformer for generating power in the electromagnetic-inductive method.

At this time, the current transformer is installed at the power line, and a core of the current transformer has the portion facing the power line exposed to the outside in order to facilitate current detection and magnetic induction.

There is a problem in that the core of the current transformer is mainly formed of a metal material, such that when it is exposed to the outside, the surface thereof is oxidized by rainwater, condensation, etc., thereby reducing its properties.

In addition, there is a problem in that the properties of the current transformer are reduced by a mechanical coupling failure when the core is coupled, a failure of the core itself, etc.

There is a problem in that the electromagnetic-inductive type power supply apparatus has the reduction in the generating efficiency due to the reduction in the above-described core properties.

SUMMARY OF THE INVENTION

The present disclosure is intended to solve the above conventional problems, and an object of the present disclosure is to provide an apparatus and a method for diagnosing a failure of an electromagnetic-inductive power supply apparatus, which diagnoses whether a power-generation current transformer has failed by comparing the values (i.e., current, voltage, and power) detected in a sensor current transformer and the power-generation current transformer, thereby preventing the generating efficiency of the electromagnetic-inductive type power supply apparatus from being reduced.

For achieving the object, an apparatus for diagnosing a failure of an electromagnetic-inductive power supply apparatus according to an embodiment of the present disclosure, as the apparatus for diagnosing a failure of the electromagnetic-inductive power supply apparatus including a sensor current transformer and a power-generation current transformer, includes a power-generation CT detection unit for detecting the electrical properties of the power-generation current transformer with a power-generation CT detection value, a sensor CT detection unit for detecting the electrical properties of the sensor current transformer with a sensor CT detection value, a converting unit for converting the power-generation CT detection value and the sensor CT detection value into a power-generation CT converted value and a sensor CT converted value by scaling at least one of the power-generation CT detection value and the sensor CT detection value, and a failure determining unit for diagnosing whether to fail based on the power-generation CT converted value and the sensor CT converted value.

For achieving the object, a method for diagnosing a failure of an electromagnetic-inductive power supply apparatus according to an embodiment of the present disclosure, as the method for diagnosing a failure of the electromagnetic-inductive power supply apparatus including a sensor current transformer and a power-generation current transformer includes detecting the electrical properties of the power-generation current transformer with a power-generation CT detection value, detecting the electrical properties of the sensor current transformer with a sensor CT detection value, converting the power-generation CT detection value and the sensor CT detection value into a power-generation CT converted value and a sensor CT converted value by scaling at least one of the power-generation CT detection value and the sensor CT detection value, and diagnosing whether to fail based on the power-generation CT converted value and the sensor CT converted value.

According to the present disclosure, it is possible for the apparatus and the method for diagnosing a failure of the electromagnetic-inductive power supply apparatus to diagnose whether the current transformer has failed by comparing the electrical properties of the sensor current transformer and the power-generation current transformer, thereby accurately detecting whether the current transformers normally operate even at the initial operation of the electromagnetic-inductive power supply apparatus.

That is, since the measured value measured in the power-generation current transformer is conventionally compared with a predetermined reference value, the normal power-generation current transformer can be determined as a failure due to the overvoltage (current) generated at the initial operation, while since the apparatus and the method for diagnosing a failure of the electromagnetic-inductive power supply apparatus compare the detected values (current, voltage, and power) of the power-generation current transformer and the sensor current transformer, it can accurately detect whether to normally operate at the initial operation.

In addition, it is possible for the apparatus and the method for diagnosing a failure of the electromagnetic-inductive power supply apparatus to diagnose whether to fail by comparing the electrical properties of the sensor current transformer and the power-generation current transformer, thereby accurately monitoring the operating state of the voltage, the current, the power, etc. of the electromagnetic-inductive power supply apparatus.

In addition, it is possible for the apparatus and the method for diagnosing a failure of the electromagnetic-inductive power supply apparatus to diagnose whether to fail by comparing the electrical properties of the sensor current transformer and the power-generation current transformer, thereby confirming a mutual failure of the sensor current transformer and the power-generation current transformer.

In addition, it is possible for the apparatus and the method for diagnosing a failure of the electromagnetic-inductive power supply apparatus to diagnose whether to fail by comparing the electrical properties of the sensor current transformer and the power-generation current transformer, thereby accurately detecting whether the power-outage of the power line has occurred.

That is, since the measured value measured in the power-generation current transformer is conventionally compared with a predetermined reference value, the normal power-generation current transformer can be determined as a failure upon the power-outage of the power line, while since the apparatus and the method for diagnosing a failure of the electromagnetic-inductive power supply apparatus compare the detected values (current, voltage, and power) of the power-generation current transformer and the sensor current transformer, it can accurately detect whether to normally operate upon a failure of the power-outage and a failure of the current transformer.

DETAILED DESCRIPTION

Hereinafter, the most preferred embodiment of the present disclosure will be described with reference to the accompanying drawings so that those skilled in the art to which the present disclosure pertains can easily practice the technical spirit of the present disclosure. First, in adding reference numerals to the components in each drawing, it is to be noted that the same components are denoted by the same reference numerals even though they are illustrated in different drawings. In addition, in the following description of the present disclosure, a detailed description of known configurations or functions will be omitted when it is determined to obscure the subject matter of the present disclosure.

Figure 1:
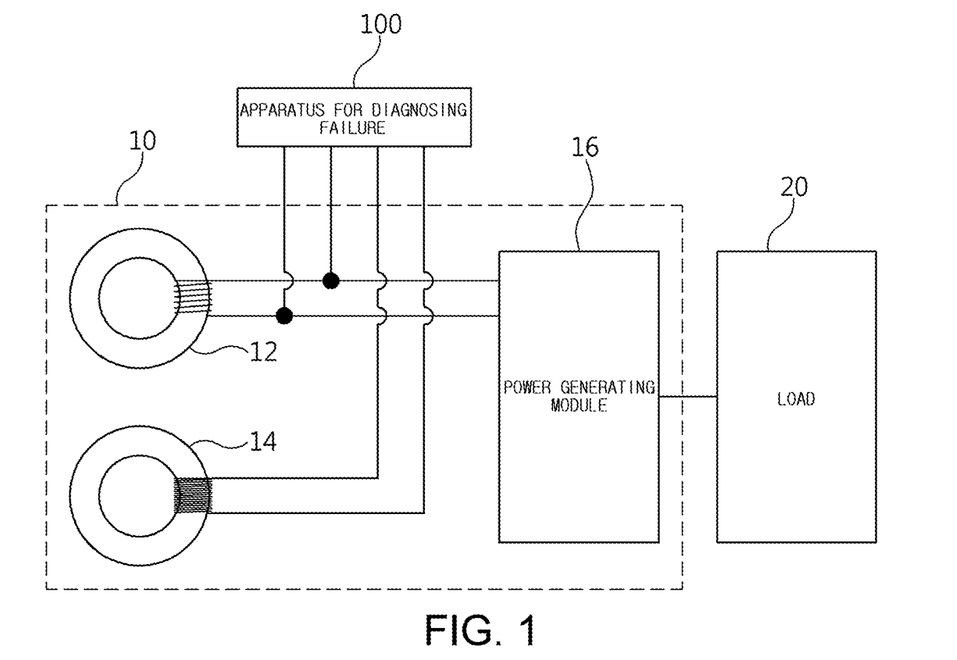
FIGS. 1 and 2 are diagrams for explaining an apparatus for diagnosing a failure of an electromagnetic-inductive power supply apparatus according to an embodiment of the present disclosure.

Referring to FIG. 1, an electromagnetic-inductive power supply apparatus 10 is configured to include a power-generation current transformer 12 for inducing a current through the electromagnetic-inductive phenomenon with a power line, a sensor current transformer 14 for detecting a current (or voltage) flowing in the power line, and a power generating module 16 for generating and supplying power to a load 20 through the current induced in the sensor current transformer 14 and the power-generation current transformer 12.

Herein, although it has been illustrated in FIG. 1 that the unit coil wound around the sensor current transformer 14 is directly connected only to an apparatus for diagnosing the failure 100 in order to easily explain an embodiment of the present disclosure, the sensor current transformer 14 is connected to a sensing apparatus (not illustrated) for detecting the electrical properties of the power line to monitor and manage them.

The apparatus for diagnosing the failure 100 is connected to a line for connecting the power-generation current transformer 12 and the sensor current transformer 14 to the power generating module 16. The apparatus for diagnosing the failure 100 detects at least one of the current, the voltage, and the power induced in the power-generation current transformer 12 and the sensor current transformer 14, respectively.

The apparatus for diagnosing the failure 100 diagnoses whether the power-generation current transformer 12 has failed, whether the sensor current transformer 14 has failed, and whether the power-outage has occurred by using the electrical properties (i.e., current, voltage, and power) detected in the power-generation current transformer 12 and the sensor current transformer 14.

Figure 2:
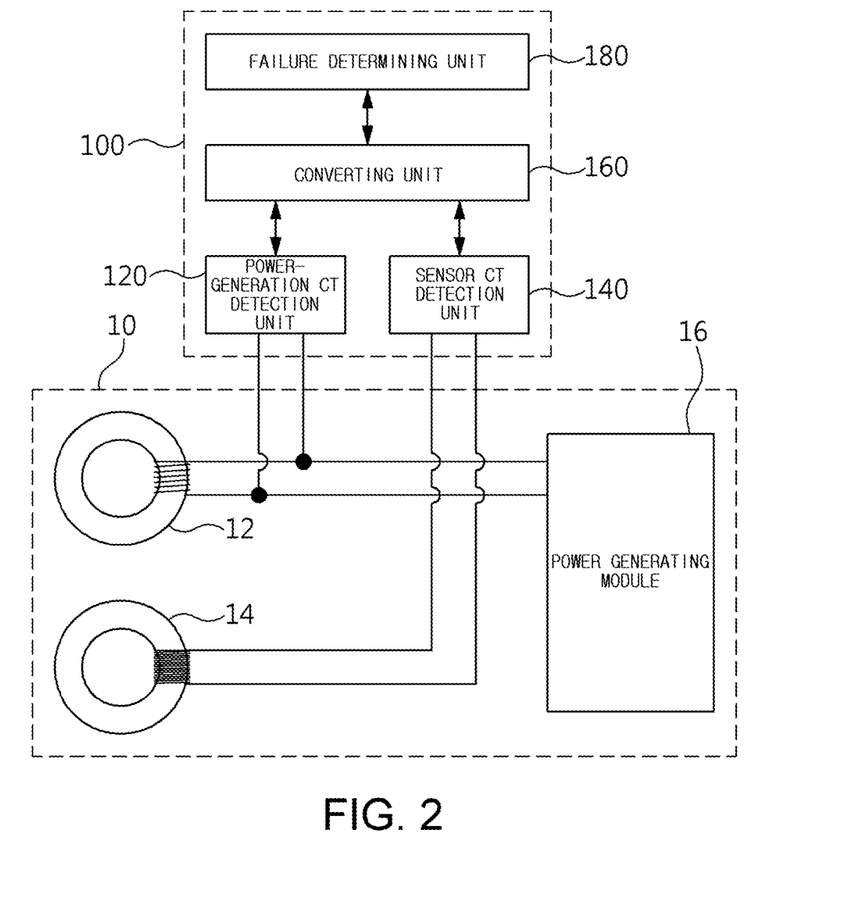

For this purpose, as illustrated in FIG. 2, the apparatus for diagnosing the failure 100 is configured to include a power-generation CT detection unit 120, a sensor CT detection unit 140, a converting unit 160, and a failure determining unit 180.

The power-generation CT detection unit 120 detects at least one of the current, the voltage, and the power induced in the power-generation current transformer 12 through the electromagnetic-inductive phenomenon between the power line and the power-generation current transformer 12. The power-generation CT detection unit 120 sets at least one of the detected current, voltage, and power as a power-generation CT detection value to transmit it to the converting unit 160.

The sensor CT detection unit 140 detects at least one of the current, the voltage, and the power induced in the sensor current transformer 14 through the electromagnetic-inductive phenomenon between the power line and the sensor current transformer 14. The sensor CT detection unit 140 sets at least one of the detected current, voltage, and power as a sensor CT detection value to transmit it to the converting unit 160. At this time, the sensor CT detection unit 140 detects the same electrical properties (i.e., current, voltage, and power) as the power-generation CT detection unit 120.

Herein, it can be understood that FIG. 2 illustrates that the unit coil of the power-generation current transformer 12 has a winding ratio lower than that of the unit coil wound around the sensor current transformer 14, such that a lower detection value is detected in the power-generation CT detection unit 120.

However, since the sensor current transformer 14 is primarily intended to measure the electrical properties of the power line, the influence of noise should be minimized in order to increase the accuracy thereof.

Therefore, the sensor current transformer 14 has the unit coil, which has the number of windings higher than that of the power-generation current transformer 12, wound thereon to induce the high electrical properties (i.e., voltage, current), and to measure the electrical properties after lowering it to a predetermined ratio.

Therefore, the electrical properties (i.e., the detection value) detected in the actual power-generation CT detection unit 120 is detected to have a value higher than the electrical properties of the sensor CT detection unit 140.

In addition, although it has been illustrated in FIG. 2 that the power-generation CT detection unit 120 and the sensor CT detection unit 140 are directly connected to the unit coils wound around the power-generation current transformer 12 and the sensor current transformer 14 to detect the electrical properties thereof, it is difficult to directly measure the electrical properties thereof, or an expensive sensing equipment is applied thereto because considerable high electrical properties (i.e., voltage, current) are induced in the power-generation current transformer 12 and the sensor current transformer 14.

Therefore, the power-generation CT detection unit 120 and the sensor CT detection unit 140 preferably detect the electrical properties after current-converting (e.g., transforming) the electrical properties induced in the current transformers 12, 14.

Since the power-generation current transformer 12 is intended for power acquisition and the sensor current transformer 14 is intended for power sensing, the unit coil is wound so that the power-generation current transformer 12 and the sensor current transformer 14 have different winding ratio from each other.

Therefore, even if the power-generation current transformer 12 and the sensor current transformer 14 are installed at the same power line, the power-generation CT detection unit 120 and the sensor CT detection unit 140 detect different detection values (i.e., current, voltage, and power) from each other.

Therefore, the converting unit 160 calculates a power-generation CT converted value and a sensor CT converted value by performing the scaling for adjusting the detection values detected in the power-generation CT detection unit 120 and the sensor CT detection unit 140 to the same level.

For this purpose, the converting unit 160 converts it into the power-generation CT converted value by scaling the power-generation CT detection value received from the power-generation CT detection unit 120. That is, the converting unit 160 scales the power-generation CT detection value based on a winding ratio of the power-generation current transformer 12 and the sensor current transformer 14. The converting unit 160 sets a value obtained by scaling the power-generation CT detection value as the power-generation CT converted value, and sets the sensor CT detection value as the sensor CT converted value.

Of course, the converting unit 160 can also to convert it into the sensor CT converted value by scaling the sensor CT detection value received from the sensor CT detection unit 140. That is, the converting unit 160 scales the sensor CT detection value based on a winding ratio of the power-generation current transformer 12 and the sensor current transformer 14. The converting unit 160 sets the power-generation CT detection value as the power-generation CT converted value, and sets a value obtained by scaling the sensor CT detection value as the sensor CT converted value.

The failure determining unit 180 diagnoses whether to fail by comparing the power-generation CT converted value and the sensor CT converted value, which have been converted in the converting unit 160. That is, the failure determining unit 180 diagnoses whether to fail including whether the power-generation current transformer 12 has failed, whether the sensor current transformer 14 has failed, whether the power-outage of the power line has occurred, etc. based on the power-generation CT converted value and the sensor CT converted value.

The failure determining unit 180 determines whether the power-generation current transformer 12 has failed by comparing the power-generation CT converted value and the sensor CT converted value. That is, when a difference value between the power-generation CT converted value and the sensor CT converted value exceeds the error range, the failure determining unit 180 determines that the power-generation current transformer 12 has failed.

At this time, since the power-generation CT converted value and the sensor CT detection value (or the power-generation CT detection value and the sensor CT converted value) exceed the error range even when the power-generation current transformer 12 is normal upon the failure of the sensor current transformer 14, the failure determining unit 180 determines that the power-generation current transformer 12 has failed.

Therefore, the failure determining unit 180 first determines whether the sensor current transformer 14 has failed by comparing the sensor CT converted value with a reference value. That is, the failure determining unit 180 stores the values (i.e., current, voltage, and power) measured in a state where the sensor current transformer 14 is normal as the reference value. When a difference between the sensor CT converted value and the reference value exceeds the error range, the failure determining unit 180 determines that the sensor current transformer 14 has failed. At this time, the failure determining unit 180 can also store it as the reference value by scaling the value measured in the state where the sensor current transformer 14 is normal by reflecting a winding ratio of the power-generation current transformer 12 and the sensor current transformer 14.

Meanwhile, the failure determining unit 180 can also determine firstly whether the sensor current transformer 14 has failed by comparing the sensor CT detection value with the reference value. That is, the failure determining unit 180 stores the values (i.e., current, voltage, and power) measured in the state where the sensor current transformer 14 is normal as the reference value. The failure determining unit 180 determines that the sensor current transformer 14 has failed when a difference between the sensor CT detection value and the reference value exceeds the error range.

The failure determining unit 180 diagnoses whether the power outage of the power line has occurred based on the power-generation CT converted value and the sensor CT converted value. That it, when the power outage of the power line installed with the power-generation current transformer 12 has occurred, the current, the voltage, and the power detected in the power-generation CT detection unit 120 keep '0' during the set time, and the power-generation CT converted value converted in the converting unit 160 also keeps '0'.

Therefore, when the power-generation CT converted value keeps '0' during the set time, the failure determining unit 180 can determine that the power outage of the power line has occurred.

However, the power-generation CT converted value can also keep '0' during the set time due to a failure of the power-generation current transformer 12 in a state where the power line is normal.

Therefore, the failure determining unit 180 determines that the power outage of the power line has occurred when the sensor CT converted value is equal to or smaller than a power-outage reference value in a state where the power-generation CT converted value has kept the power-outage reference value or less during the set time.

At this time, when the sensor CT converted value exceeds the power-outage reference value in the state where the power-generation CT converted value has kept the power-outage reference value or less during the set time, the failure determining unit 180 determines that the power-generation current transformer 12 has failed.

Figure 3:
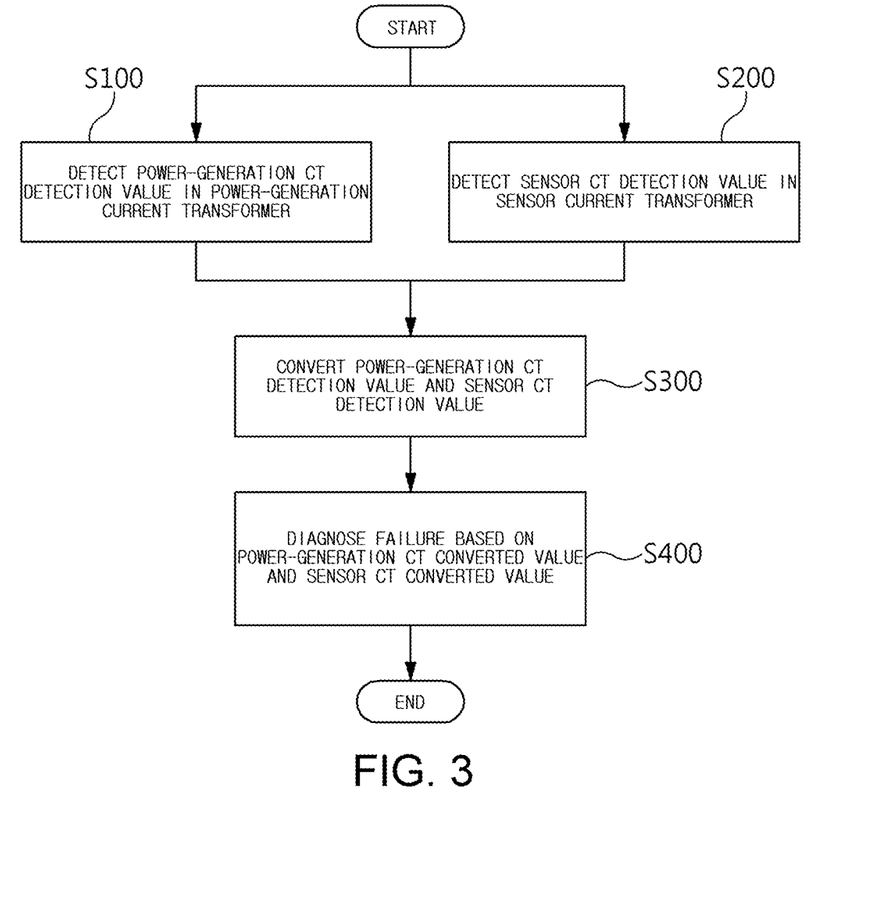
FIG. 3 is a flowchart for explaining a method for diagnosing a failure of the electromagnetic-inductive power supply apparatus according to an embodiment of the present disclosure.

Referring to FIG. 3, the apparatus for diagnosing the failure 100 detects the power-generation CT detection value, which is the electrical property of the power-generation current transformer 12 S100. That is, the apparatus for diagnosing the failure 100 detects the power-generation CT detection value including at least one of the current, the voltage, and the power induced in the power-generation current transformer 12 through the electromagnetic-inductive phenomenon between the power line and the power-generation current transformer 12.

The apparatus for diagnosing the failure 100 detects the sensor CT detection value, which is the electrical property of the sensor current transformer 14 S200. That is, the apparatus for diagnosing the failure 100 detects the sensor CT detection value including at least one of the current, the voltage, and the power induced in the sensor current transformer 14 through the electromagnetic-inductive phenomenon between the power line and the sensor current transformer 14. At this time, the apparatus for diagnosing the failure 100 detects the same electrical properties (i.e., current, voltage, and power) as the power-generation CT detection value detected in the S100.

The apparatus for diagnosing the failure 100 scales and converts the power-generation CT detection value and the sensor CT detection value, which have been detected S300. That is, since the power-generation current transformer 12 is intended for power acquisition and the sensor current transformer 14 is intended for power sensing, the unit coil is wound thereon so that the power-generation current transformer 12 and the sensor current transformer 14 have different winding ratio from each other.

Therefore, even if the power-generation current transformer 12 and the sensor current transformer 14 are installed at the same power line, the power-generation CT detection unit 120 and the sensor CT detection unit 140 detect different detection values (i.e., current, voltage, and power) from each other.

Therefore, the apparatus for diagnosing the failure 100 converts it into the power-generation CT converted value and the sensor CT converted value by performing the scaling for adjusting the power-generation CT detection value and the sensor CT detection value to the same level.

At this time, the apparatus for diagnosing the failure 100 converts it into the power-generation CT converted value by scaling the power-generation CT detection value. That is, the apparatus for diagnosing the failure 100 scales the power-generation CT detection value based on the winding ratio of the power-generation current transformer 12 and the sensor current transformer 14. The apparatus for diagnosing the failure 100 sets a value obtained by scaling the power-generation CT detection value as the power-generation CT converted value, and sets the sensor CT detection value as the sensor CT converted value.

At this time, the apparatus for diagnosing the failure 100 can also convert it into the sensor CT converted value by scaling the sensor CT detection value. That is, the apparatus for diagnosing the failure 100 scales the sensor CT detection value based on the winding ratio of the power-generation current transformer 12 and the sensor current transformer 14. The apparatus for diagnosing the failure 100 sets the power-generation CT detection value as the power-generation CT converted value, and sets a value obtained by scaling the sensor CT detection value as the sensor CT converted value.

The apparatus for diagnosing the failure 100 performs diagnosing a failure based on the power-generation CT converted value and the sensor CT converted value, which have been converted S400. That is, the apparatus for diagnosing the failure 100 diagnoses whether to fail by comparing the power-generation CT converted value and the sensor CT converted value, which have been converted in the S300. At this time, the apparatus for diagnosing the failure 100 diagnoses whether to fail including whether the power-generation current transformer 12 has failed, whether the sensor current transformer 14 has failed, whether the power outage of the power line has occurred, etc.

Figure 4:
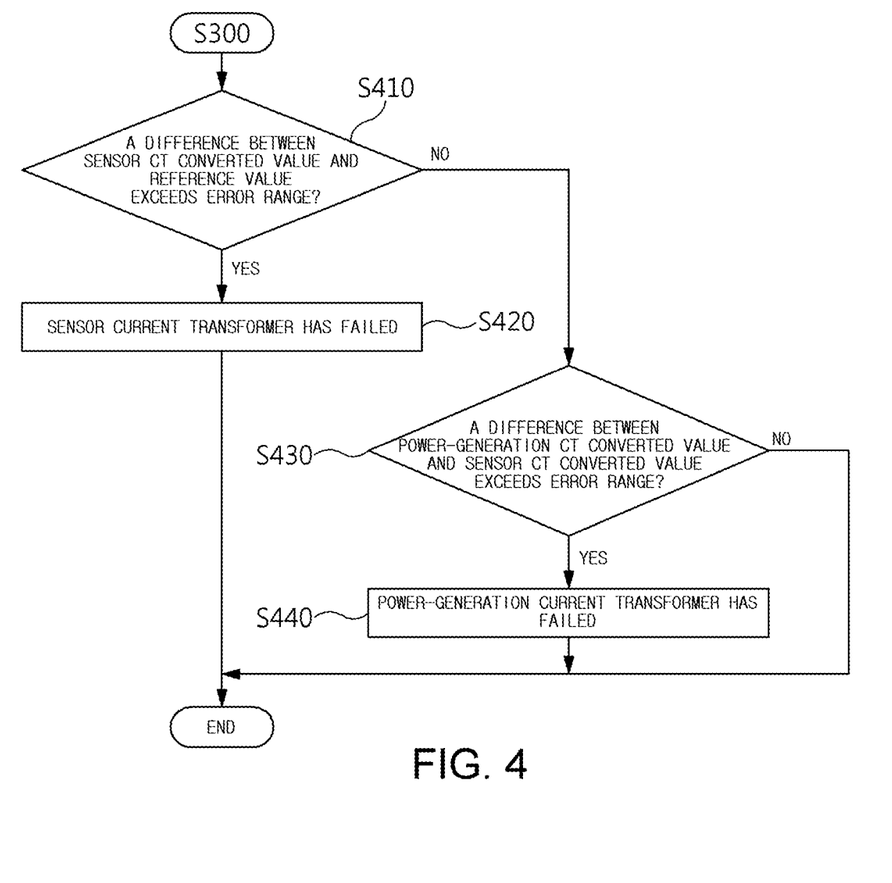
FIGS. 4 and 5 are flowcharts for explaining diagnosing a failure of FIG. 3.

Referring to FIG. 4, in the S400, the apparatus for diagnosing the failure 100 determines whether the power-generation current transformer 12 has failed by comparing the power-generation CT converted value and the sensor CT converted value. That is, when a difference value between the power-generation CT converted value and the sensor CT converted value exceeds the error range, the failure determining unit 180 determines that the power-generation current transformer 12 has failed.

The apparatus for diagnosing the failure 100 diagnoses whether the current transformers (i.e., the sensor current transformer 14 and the power-generation current transformer 12) have failed based on the sensor CT converted value and the power-generation CT converted value.

Since the power-generation CT converted value and the sensor CT detection value (or the power-generation CT detection value and the sensor CT converted value) exceed the error range even when the power-generation current transformer 12 is normal upon the failure of the sensor current transformer 14, the apparatus for diagnosing the failure 100 can also determine that the power-generation current transformer 12 has failed.

Therefore, the apparatus for diagnosing the failure 100 firstly determines whether the sensor current transformer 14 has failed by comparing the sensor CT converted value with the reference value. That is, the apparatus for diagnosing the failure 100 stores the values (i.e., current, voltage, and power) measured in the state where the sensor current transformer 14 is normal as the reference value. At this time, the apparatus for diagnosing the failure 100 can also store it as the reference value by scaling the value measured in the state where the sensor current transformer 14 is normal by reflecting the winding ratio of the power-generation current transformer 12 and the sensor current transformer 14.

The apparatus for diagnosing the failure 100 determines whether the sensor current transformer 14 has failed by comparing a difference between the sensor CT converted value and the reference value with the error range in a state where the values (i.e., current, voltage, and power) measured in the state where the sensor current transformer 14 is normal have been stored as the reference value. At this time, when a difference between the sensor CT converted value and the reference value exceeds the error range (YES in S410), the apparatus for diagnosing the failure 100 determines that the sensor current transformer 14 has failed S420.

The apparatus for diagnosing the failure 100 determines whether the power-generation current transformer 12 has failed by comparing a difference between the power-generation CT converted value and the sensor CT converted value with the error range when the sensor current transformer 14 is normal. At this time, when a difference between the power-generation CT converted value and the sensor CT converted value exceeds the error range (YES in S430), the apparatus for diagnosing the failure 100 determines that the power-generation current transformer 12 has failed S440.

Figure 5:
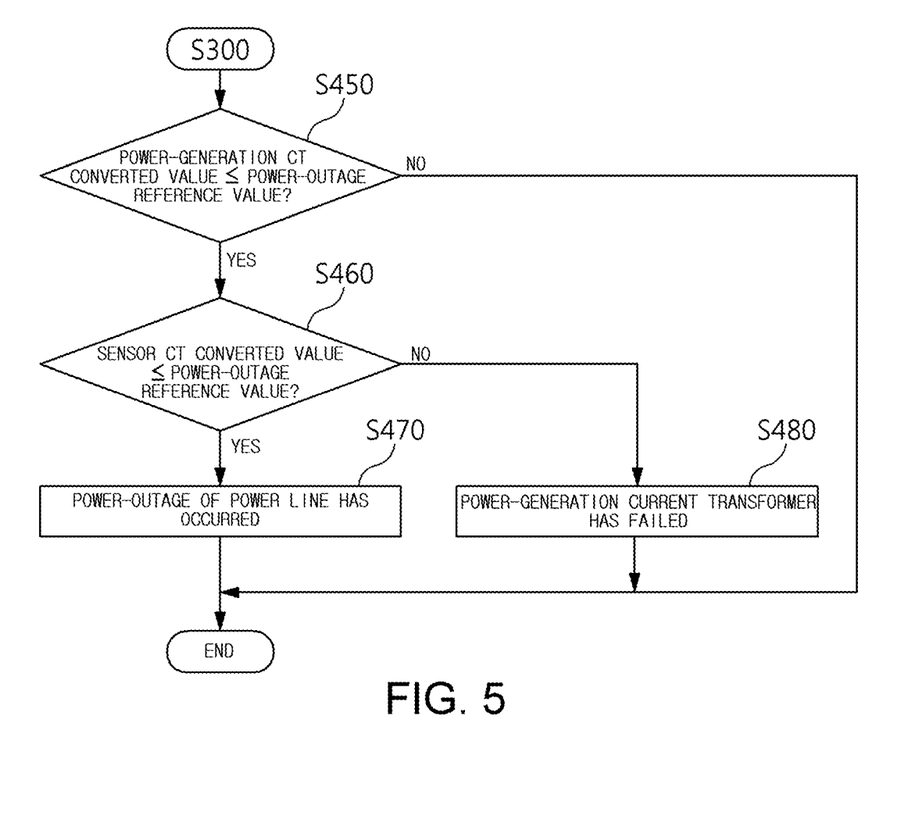

Referring to FIG. 5, in the S400, the apparatus for diagnosing the failure 100 can diagnose whether the power outage of the power line has occurred by using the power-generation CT converted value and the sensor CT converted value. That is, when the power outage of the power line installed with the power-generation current transformer 12 has occurred, the power-generation CT detection values (i.e., current, voltage, and power) detected in the power-generation current transformer 12 keeps '0' during the set time, and the converted power-generation CT converted value also keeps '0'.

Therefore, the apparatus for diagnosing the failure 100 can determine that the power outage of the power line has occurred when the power-generation CT converted value keeps '0' during the set time.

However, the power-generation CT converted value can also keep '0' during the set time due to a failure of the power-generation current transformer 12 in the state where the power line is normal.

Therefore, the apparatus for diagnosing the failure 100 determines that the power outage of the power line has occurred when the sensor CT converted value is equal to or smaller than the power-outage reference value in the state where the power-generation CT converted value has kept the power-outage reference value or less during the set time. That is, when the power-generation CT converted value keeps the power-outage reference value or less during the set time (YES in S450), the apparatus for diagnosing the failure 100 compares the sensor CT converted value with the power-outage reference value. At this time, when the sensor CT converted value is equal to or smaller than the power-outage reference value (YES in S460), the apparatus for diagnosing the failure 100 diagnoses that the power-outage of the power line has occurred. That is, the apparatus for diagnosing the failure 100 diagnoses that the power-outage of the power line, at which the power-generation current transformer 12 and the sensor current transformer 14 are installed, has occurred.

Meanwhile, when the sensor CT converted value exceeds the power-outage reference value in the state where the power-generation CT converted value has kept the power-outage reference value or less during the set time, the apparatus for diagnosing the failure 100 determines that the power-generation current transformer 12 has failed. That is, when the sensor CT converted value exceeds the power-outage reference value in the state where the power-generation CT converted value has kept the power-outage reference value or less during the set time, the apparatus for diagnosing the failure 100 diagnoses that the power-generation current transformer 12 has failed S480.

As described above, it is possible for the apparatus and the method for diagnosing a failure of the electromagnetic-inductive power supply apparatus to diagnose whether the current transformer has failed by comparing the electrical properties of the sensor current transformer and the power-generation current transformer, thereby accurately detecting whether the current transformers normally operate even at the initial operation of the electromagnetic-inductive power supply apparatus.

That is, since the measured value measured in the power-generation current transformer is conventionally compared with a predetermined reference value, the normal power-generation current transformer can be determined as a failure due to the overvoltage (current) generated at the initial operation, while since the apparatus and the method for diagnosing a failure of the electromagnetic-inductive power supply apparatus compare the detected values (current, voltage, and power) of the power-generation current transformer and the sensor current transformer, it can accurately detect whether to normally operate at the initial operation.

In addition, it is possible for the apparatus and the method for diagnosing a failure of the electromagnetic-inductive power supply apparatus to diagnose whether to fail by comparing the electrical properties of the sensor current transformer and the power-generation current transformer, thereby accurately monitoring the operating state of the voltage, the current, the power, etc. of the electromagnetic-inductive power supply apparatus.

In addition, it is possible for the apparatus and the method for diagnosing a failure of the electromagnetic-inductive power supply apparatus to diagnose whether to fail by comparing the electrical properties of the sensor current transformer and the power-generation current transformer, thereby confirming a mutual failure of the sensor current transformer and the power-generation current transformer.

In addition, it is possible for the apparatus and the method for diagnosing a failure of the electromagnetic-inductive power supply apparatus to diagnose whether to fail by comparing the electrical properties of the sensor current transformer and the power-generation current transformer, thereby accurately detecting whether the power-outage of the power line has occurred.

That is, since the measured value measured in the power-generation current transformer is conventionally compared with a predetermined reference value, the normal power-generation current transformer can be determined as a failure upon the power-outage of the power line, while since the apparatus and the method for diagnosing a failure of the electromagnetic-inductive power supply apparatus compare the detected values (current, voltage, and power) of the power-generation current transformer and the sensor current transformer, it can accurately detect whether to normally operate upon a failure of the power-outage and a failure of the current transformer.

As described above, although preferred embodiments of the present disclosure have been described, it is to be understood that they can be modified into various forms, and various modifications and changes thereof can be embodied by those skilled in the art without departing from the claims of the present disclosure.

The invention claimed is:

1. An apparatus for diagnosing a failure of an electromagnetic-inductive power supply apparatus including a sensor current transformer and a power-generation current transformer, comprising:

a power-generation CT detection unit for detecting an electrical property of the power-generation current transformer with a power-generation CT detection value;

a sensor CT detection unit for detecting an electrical property of the sensor current transformer with a sensor CT detection value;

a converting unit for converting the power-generation CT detection value and the sensor CT detection value into a power-generation CT converted value and a sensor CT converted value by scaling at least one of the power-generation CT detection value and the sensor CT detection value; and a failure determining unit for diagnosing whether to fail based on the power-generation CT converted value and the sensor CT converted value.

2. The apparatus for diagnosing the failure of the electromagnetic-inductive power supply apparatus of claim 1, wherein the electrical property is at least one of current, voltage, and power.

3. The apparatus for diagnosing the failure of the electromagnetic-inductive power supply apparatus of claim 1, wherein the converting unit sets the power-generation CT detection value as the power-generation CT converted value by scaling the power-generation CT detection value based on a winding ratio of the sensor current transformer and the power-generation current transformer, and sets the sensor CT detection value as the sensor CT converted value.

4. The apparatus for diagnosing the failure of the electromagnetic-inductive power supply apparatus of claim 1, wherein the converting unit sets the sensor CT detection value as the sensor CT converted value by scaling the sensor CT detection value based on a winding ratio of the sensor current transformer and the power-generation current transformer, and sets the power-generation CT detection value as the power-generation CT converted value.

5. The apparatus for diagnosing the failure of the electromagnetic-inductive power supply apparatus of claim 1, wherein the converting unit sets the power-generation CT detection value and the sensor CT detection value as the power-generation CT converted value and the sensor CT converted value by scaling the power-generation CT detection value and the sensor CT detection value based on a winding ratio of the sensor current transformer and the power-generation current transformer.

6. The apparatus for diagnosing the failure of the electromagnetic-inductive power supply apparatus of claim 1, wherein the failure determining unit determines that the power-generation current transformer has failed when a difference between the sensor CT converted value and the power-generation CT converted value exceeds the error range.

7. The apparatus for diagnosing the failure of the electromagnetic-inductive power supply apparatus of claim 1, wherein the failure determining unit determines that the sensor current transformer has failed when the detection value of the sensor CT detection unit exceeds an error range of a reference value.

8. The apparatus for diagnosing the failure of the electromagnetic-inductive power supply apparatus of claim 1, wherein the failure determining unit determines that a power-outage has occurred when the power-generation CT converted value has kept a power-outage reference value or less during a set time, and the sensor CT converted value is equal to or smaller than the power-outage reference value.

9. The apparatus for diagnosing the failure of the electromagnetic-inductive power supply apparatus of claim 1, wherein the failure determining unit determines that the power-generation current transformer has failed when the power-generation CT converted value has kept a power-outage reference value or less during a set time, and the sensor CT converted value is equal to or greater than the power-outage reference value.

10. A method for diagnosing a failure of an electromagnetic-inductive power supply apparatus including a sensor current transformer and a power-generation current transformer, comprising:

detecting an electrical property of the power-generation current transformer with a power-generation CT detection value;

detecting an electrical property of the sensor current transformer with a sensor CT detection value;

converting the power-generation CT detection value and the sensor CT detection value into a power-generation CT converted value and a sensor CT converted value by scaling at least one of the power-generation CT detection value and the sensor CT detection value; and diagnosing whether to fail based on the power-generation CT converted value and the sensor CT converted value.

11. The method for diagnosing the failure of the electromagnetic-inductive power supply apparatus of claim 10, wherein the electrical property is at least one of current, voltage, and power.

12. The method for diagnosing the failure of the electromagnetic-inductive power supply apparatus of claim 10, wherein the converting comprises
setting the power-generation CT detection value as the power-generation CT converted value by scaling the power-generation CT detection value based on a winding ratio of the sensor current transformer and the power-generation current transformer; and
setting the sensor CT detection value as the sensor CT converted value.

13. The method for diagnosing the failure of the electromagnetic-inductive power supply apparatus of claim 10, wherein the converting comprises
setting the sensor CT detection value as the sensor CT converted value by scaling the sensor CT detection value based on a winding ratio of the sensor current transformer and the power-generation current transformer; and
setting the power-generation CT detection value as the power-generation CT converted value.

14. The method for diagnosing the failure of the electromagnetic-inductive power supply apparatus of claim 10, wherein the converting comprises
setting the power-generation CT detection value as the power-generation CT converted value by scaling the power-generation CT detection value based on a winding ratio of the sensor current transformer and the power-generation current transformer; and
setting the sensor CT detection value as the sensor CT converted value by scaling the sensor CT detection value based on the winding ratio of the sensor current transformer and the power-generation current transformer.

15. The method for diagnosing the failure of the electromagnetic-inductive power supply apparatus of claim 10, wherein the diagnosing whether to fail comprises determining that the power-generation current transformer has failed when a difference between the sensor CT converted value and the power-generation CT converted value exceeds an error range.

16. The method for diagnosing the failure of the electromagnetic-inductive power supply apparatus of claim 10, wherein the diagnosing whether to fail comprises determining that the sensor current transformer has failed when the sensor CT detection value exceeds an error range of a reference value.

17. The method for diagnosing the failure of the electromagnetic-inductive power supply apparatus of claim 10, wherein the diagnosing whether to fail comprises determining that the power-outage has occurred when the power-generation CT converted value has kept a power-outage reference value or less during a set time, and the sensor CT converted value is equal to or smaller than the power-outage reference value.

18. The method for diagnosing the failure of the electromagnetic-inductive power supply apparatus of claim 10, wherein the diagnosing whether to fail comprises determining that the power-generation current transformer has failed when the power-generation CT converted value has kept a power-outage reference value or less during a set time, and the sensor CT converted value is equal to or greater than the power-outage reference value.

\* \* \* \* \*